(12) United States Patent
Kuramoto (10) Patent No.: US 7,756,177 B2
(45) Date of Patent: Jul. 13, 2010

(54) SEMICONDUCTOR LIGHT-EMITTING DEVICE

(75) Inventor: Kyosuke Kuramoto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 349 days.

(21) Appl. No.: 11/326,503

(22) Filed: Jan. 6, 2006

(65) Prior Publication Data
US 2006/0193359 A1 Aug. 31, 2006

(30) Foreign Application Priority Data
Feb. 25, 2005 (JP) .............. 2005-051279
Sep. 1, 2005 (JP) .............. 2005-253412

(51) Int. Cl.
*H01S 5/00* (2006.01)
(52) U.S. Cl. .............. 372/45.01; 372/43.01; 372/46.01
(58) Field of Classification Search ......... 372/39–46.01
See application file for complete search history.

(56) References Cited

U.S. PATENT DOCUMENTS

| 5,509,026 | A | * | 4/1996 | Sasaki et al. ............. 372/45.01 |
| 6,028,877 | A | | 2/2000 | Kimura |
| 6,175,582 | B1 | | 1/2001 | Naito et al. |
| 6,377,597 | B1 | * | 4/2002 | Okumura ................. 372/45.01 |
| 6,847,667 | B2 | | 1/2005 | Ohkubo et al. |
| 7,142,575 | B2 | | 11/2006 | Yamasaki et al. |
| 2004/0125839 | A1 | * | 7/2004 | Lee et al. ....................... 372/45 |
| 2005/0226295 | A1 | * | 10/2005 | Taneya et al. ............ 372/45.01 |

FOREIGN PATENT DOCUMENTS

| CN | 1561567 A | 1/2005 |
| JP | 02-254784 | 10/1990 |
| JP | 8-274403 A | 10/1996 |
| JP | 10-173292 | 6/1998 |

(Continued)

OTHER PUBLICATIONS

G. P. Agrawal, N. K. Dutta, Semiconductor Lasers (Kluwer Academic Publishers, Norwell, Massachusetts, 1993).*

(Continued)

*Primary Examiner*—Armando Rodriguez
*Assistant Examiner*—Xnning Niu
(74) *Attorney, Agent, or Firm*—Leydig, Voit & Mayer, Ltd.

(57) ABSTRACT

A semiconductor laser, having an active layer with a double-quantum-well structure, includes two InGaN well layers, each of which has a thickness of 5 nm. The threshold current deteriorates to a relatively small degree while differential efficiency is improved considerably in a region having a light confinement coefficient $\Gamma$ of 3.0% or less. The light confinement coefficient indicates the proportion of light in the well layers with respect to light in the light emitting device, during light emission. When the light confinement coefficient $\Gamma$ is less than 1.5%, the threshold current increases considerably and the improvement in differential efficiency becomes small. It is therefore preferable that the lower limit of the light confinement coefficient $\Gamma$ be about 1.5%. A differential efficiency of 1.6 W/A or more is obtained when light the confinement coefficient $\Gamma$ is 3.0% or less, and a differential efficiency of 1.7 W/A or more is obtained when the light confinement coefficient $\Gamma$ is 2.6% or less.

5 Claims, 8 Drawing Sheets

FOREIGN PATENT DOCUMENTS

| JP | 10-261838 | 9/1998 |
| JP | 11-163458 | 6/1999 |
| JP | 2004-221428 | 8/2004 |
| JP | 2004-253776 | 9/2004 |

OTHER PUBLICATIONS

B. R. Bennett et al., "Carrier-Induced Change in Refractive Index of InP, GaAs, and InGaAsP," IEEE J. Quantum Electronics, vol. 26, No. 1, pp. 113-122, 1990.*

M. Pophristic et al., "Time-resolved photoluminescence measurements of InGaN lgiht emitting diodes," Appl. Phys. Lett., vol. 73, No. 24, pp. 3550-3552, 1998.*

M. Pophristic et al., "Monte Carlo simulations applied to Al~GavIn1-x-yX quaternary alloys (X=As,P,N): A comparative study," Pysical Review, B71, pp. 205204-1-205204-11, 2005.*

G. P. Agrawal, Ed., Semiconductor Lasers: Past, Present, and Future (AIP Press, New York, 1995), pp. 12-13.*

M. J. Bergmann et al., "Optical-field calculations for lossy multiple-layer AlxGa1-xN/InxGa1-xN laser diodes", J. Appl. Phys., vol. 84, No. 3, (1998).*

Bergmann et al., "Optical-Field Calculations for Lossy Multiple-Layer $Al_xGa_{1-x}N/In_xGa_{1-x}N$ Laser Diodes", Journal of Applied Physics, Aug. 1, 1998, vol. 84 No. 3; pp. 1196-1203, Durham, North Carolina.

Chon et al., "Analysis of Optical Gain and Threshold Current Density of Wurtzite InGaN/GaN/AlGaN Quantum Well Lasers", Journal of Applied Physics, Aug. 15, 1998, vol. 84, No. 4, pp. 1813-1819, Singapore.

* cited by examiner

SEMICONDUCTOR LIGHT-EMITTING DEVICE

BACKGROUND OF THE INVENTION

1. Field of the Invention

The present invention relates to semiconductor light-emitting devices such as semiconductor lasers and light-emitting diodes using Group III-V nitride compound semiconductors.

2. Description of the Background Art

As semiconductor lasers capable of light emission over a region ranging from blue to ultraviolet that is necessary for greater density of optical disc, research and development has been actively conducted in recent years on nitride semiconductor lasers using Group III-V nitride compound semiconductors such as AlGaInN, which have been put to practical use.

Nitride semiconductor lasers reported to date have, as their active layer structure, a multi-quantum-well structure in which a well layer made of InGaN (InGaN well layer) and a barrier layer made of InGaN (InGaN barrier layer) and having a lower In composition ratio (commonly about 0.02) than the well layer are alternately laminated. As an example of semiconductor lasers having an active layer of this multi-quantum-well structure, Japanese Patent Application Laid-Open No. 10-261838 (1998) discloses a gallium nitride semiconductor light-emitting device.

The In composition ratio (which means "x" in $In_xGa_{(1-x)}$) of the InGaN well layer takes on various values in accordance with an oscillation wavelength or the thickness of the well layer (well thickness). With the oscillation wavelength being 405 nm and the well thickness being 5.0 nm, for example, the value is about 0.12. It is generally known, however, that the value of In composition ratio in fact varies depending on the position in a layer direction (perpendicular to a growth direction) of the well layer, namely the In composition ratio fluctuates considerably along the layer direction of the well layer. The magnitude of the fluctuations can be as small as several nm, and reach as large as several hundred nm.

Such fluctuations in element composition ratio are a property not seen in materials such as GaAs, AlGaAs, AlGaP and AlGaInP that are often used for a well layer in GaAs LDs, or materials such as InGaAs and InGaAsP that are often used for a well layer in InP LDs.

As has been described, in a semiconductor light-emitting devices such as a semiconductor laser having an active layer of multi-quantum-well structure that includes the InGaN well layer and InGaN barrier layer, fluctuations in the In composition ratio occur in the layer direction of the InGaN well layer. This has rendered semiconductor light-emitting devices having sufficiently high differential efficiency unobtainable.

SUMMARY OF THE INVENTION

It is an object of the present invention to provide a semiconductor light-emitting device using a Group III-V nitride compound semiconductor and having differential efficiency higher than conventional ones.

In a first aspect of the present invention, a semiconductor light-emitting device uses a Group III-V nitride compound semiconductor and having an active layer of multi-quantum-well structure that includes at least two well layers. The at least two well layers include at least two InGaN well layers, and a light confinement coefficient (%) is set to 1.5 or more and 3.0 or less, the light confinement coefficient indicating a proportion of light in the at least two InGaN well layers to overall waveguide light of the device at the time of light emission.

This semiconductor light-emitting device attains high differential efficiency of 1.6 W/A or more while controlling a threshold current to a practical level, when a front-end face has 10% reflectivity and a rear-end face has 95% reflectivity, for example.

In a second aspect of the present invention, a semiconductor light-emitting device uses a Group III-V nitride compound semiconductor, and includes an active layer. The active layer has a multi-quantum-well structure that includes at least two well layers, and a light confinement coefficient (%) is set to 1.5 or more and 3.0 or less, the light confinement coefficient indicating a proportion of light in the at least two well layers.

This semiconductor light-emitting device attains high differential efficiency of 1.6 W/A or more while controlling a threshold current to a practical level, when a front-end face has 10% reflectivity and a rear-end face has 95% reflectivity, for example.

These and other objects, features, aspects and advantages of the present invention will become more apparent from the following detailed description of the present invention when taken in conjunction with the accompanying drawings.

DESCRIPTION OF THE PREFERRED EMBODIMENTS

Principle of the Invention (Study of Problems)

Having a negative correlation, band gap of an InGaN material decreases with an increase of In composition ratio. Accordingly, the existence of In composition ratio fluctuations in the layer direction of the InGaN well layer, which is responsible for the conventional problem, means that a band gap in the well layer varies depending on the position in the layer direction.

Figure 1:
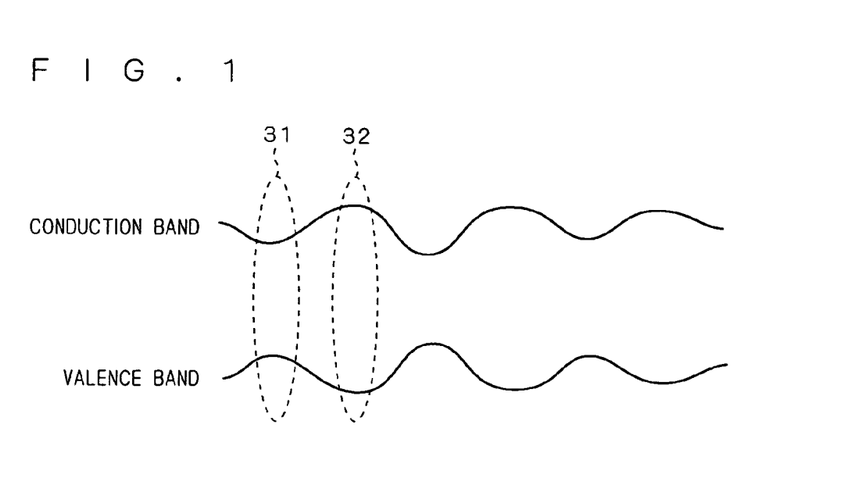
FIG. 1 illustrates the state of band gap due to In composition ratio fluctuations in a layer direction of an InGaN well layer.

FIG. 1 illustrates the state of band gap due to the In composition ratio fluctuations in the layer direction of the InGaN well layer. As shown, the band gap decreases relatively in a high-In-composition-ratio region 31, and increases relatively in a low-In-composition-ratio region 32.

Figure 2:
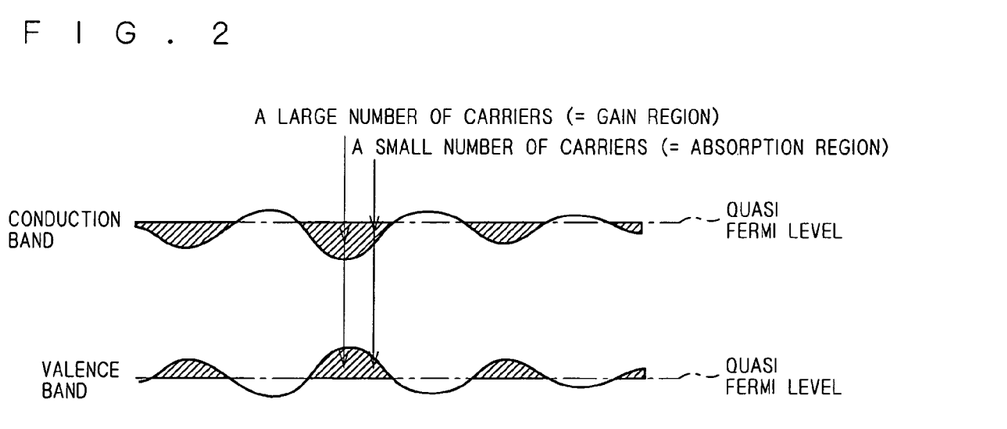
FIG. 2 illustrates the existences of a gain region and an absorption region in the InGaN well layer.

FIG. 2 illustrates the existences of a gain region and an absorption region in the InGaN well layer. As shown, when the InGaN well layer injected with electrons and holes oscillates a laser, carriers are present in a large amount in a region of a small band gap, while carriers are present in a small amount in a region of a big band gap. This is a phenomenon resulting from carrier diffusion in the InGaN well layer.

In a well layer serving as a gain region of a semiconductor laser, the magnitude of gain is usually determined by the magnitude of carrier density. That is, a region of carrier density higher than a given value (which is called a transparent carrier density) serves as a gain region, while a region of carrier density lower than the transparent carrier density exhibits negative gain, namely serves as a light absorption region.

Considering the facts mentioned above, a Group III-V nitride compound semiconductor laser using an InGaN material for a well layer includes, even at the time of oscillation, a gain region and an additional light absorption region of carrier density lower than the transparent carrier density as shown in FIG. 2, with light absorption presumably occurring in the absorption region.

Meanwhile, assuming that front-end face reflectivity is Rf, rear-end face reflectivity is Rr, a resonator length is L, internal quantum efficiency is $\eta i$, and internal loss is $\alpha i$, total differential efficiency $\eta total$ which is the sum of differential efficiencies on the front-end face and rear-end face of a semiconductor laser is expressed by the following equation (1):

$$\eta total = \eta i \cdot \frac{\ln\left(\frac{1}{Rf \cdot Rr}\right)}{2 \cdot \alpha i \cdot L + \ln\left(\frac{1}{Rf \cdot Rr}\right)} \quad (1)$$

Therefore, the existence of light absorption in the InGaN well layer as mentioned above means a high internal loss $\alpha i$, which in turn means an increase in internal loss $\alpha i$ involves a corresponding decrease in total differential efficiency $\eta total$. In such ways, the light absorption in the well layer that occurs due to the In composition ratio fluctuations in the well layer is an obstacle for the Group III-V nitride compound semiconductor laser to attain high total differential efficiency $\eta total$.

Most of the Group III-V nitride compound semiconductor lasers reported to date attempt to increase differential efficiency obtained from the front by coating the front with low reflectivity of about 10% and the rear with high reflectivity of about 95%. Nevertheless, the obstacle resulting from the In composition ratio fluctuations prevents the differential efficiency on the front-end face from becoming more than 1.6 W/A. There have been no reports of semiconductor lasers having differential efficiency of 1.6 W/A or more.

(Study of Solution to the Problems)

For the Group III-V nitride compound semiconductor laser to attain high differential efficiency, it is indispensable to reduce the light absorption in the InGaN well layer that occurs due to the In composition ratio fluctuations.

Since the light absorption in the InGaN well layer is in proportion to a light confinement coefficient $\Gamma$ in the well layer (proportion of light in the well layer to overall waveguide light of the semiconductor laser at the time of light emission), it is effective to reduce the light confinement coefficient $\Gamma$ in order to reduce the light absorption in the well layer.

However, since the gain of laser light, namely mode gain is in proportion to the light confinement coefficient $\Gamma$ as well, reduction of the light confinement coefficient $\Gamma$ involves reduction of the mode gain. This increases a carrier density (threshold carrier density) required for oscillation, causing a problem of increasing an oscillation threshold value (threshold current) in the light output-current properties. Because of this problem, the conventional Group III-V nitride compound semiconductor lasers have been commonly designed and manufactured with the light confinement coefficient $\Gamma$ to the well layer being from about 3.5 to about 4.5%.

Due to the foregoing problem, extreme reduction of the light confinement coefficient $\Gamma$ to the well layer is undesirable and has not been done in conventional lasers using GaAs materials or InP materials either.

When technical common knowledge prevails that the appropriate light confinement coefficient $\Gamma$ to the well layer is from about 3.5 to about 4.5% as mentioned above, the inventor of this application fabricated experimentally a Group III-V nitride compound semiconductor laser by further reducing the light confinement coefficient $\Gamma$, and studied the possibility of enhancing differential efficiency.

Figure 3:
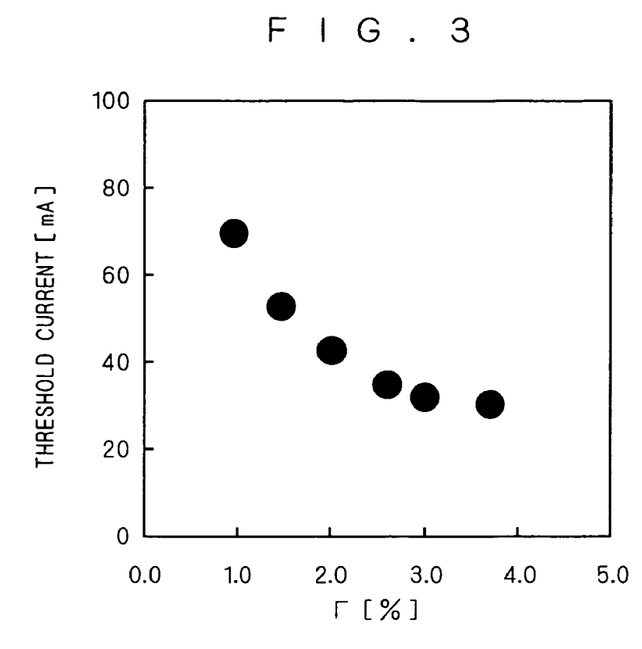
FIG. 3 is a graph illustrating the dependence of a threshold current on a light confinement coefficient $\Gamma$.
Figure 4:
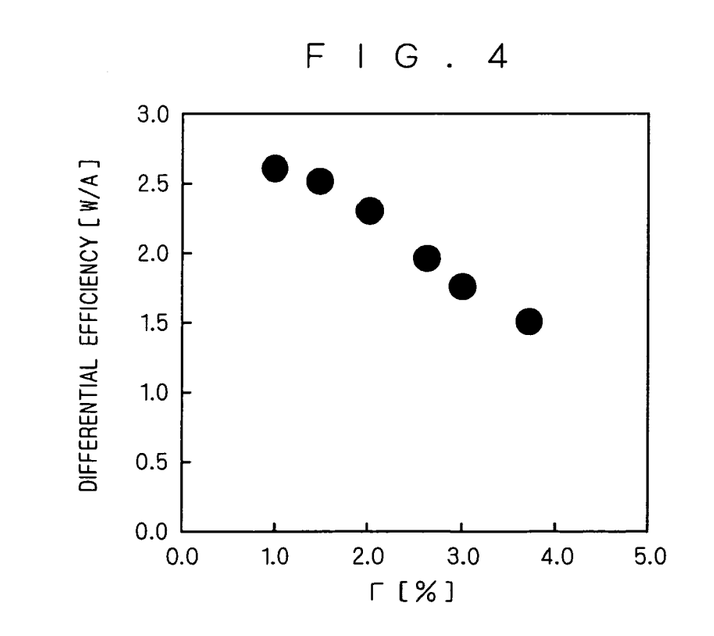
FIG. 4 is a graph illustrating the dependence of differential efficiency of laser light emitted from a front-end face on the light confinement coefficient $\Gamma$.

FIG. 3 is a graph illustrating the dependence of a threshold current on the light confinement coefficient $\Gamma$ (hereafter sometimes abbreviated as "$\Gamma$ dependence"). FIG. 4 is a graph illustrating the $\Gamma$ dependence of differential efficiency of laser light emitted from a front-end face, with the front-end face being coated with 10% reflectivity and a rear-end face with 95% reflectivity.

The light confinement coefficient $\Gamma$ to the well layer was obtained by doing simulation of light intensity distribution from a refractive index with respect to a laser layer structure on a two-dimensional surface perpendicular to the direction of light travel, and then calculating a proportion of light intensity in a region corresponding to the well layer to the whole. The light confinement coefficient $\Gamma$ in the multi-quantum-well structure means the sum of the respective confinement coefficients $\Gamma$ of a plurality of well layers.

In the fabricated semiconductor laser, an active layer has a double-quantum-well structure including two well layers each of which has a thickness of 5 nm. Conventionally, the light confinement coefficient $\Gamma$ to the well layer in such structure is about 3.7%, with a threshold current being 30 mA or less (see FIG. 3), and differential efficiency being 1.5 W/A or less (see FIG. 4).

Review of a region having the light confinement coefficient $\Gamma$ of 3.0% or less found, however, that the threshold current deteriorates (increases) to a relatively small degree from the $\Gamma$ dependence of threshold current illustrated in FIG. 3, while the differential efficiency is improved (increases) considerably from the Γ dependence of differential efficiency illustrated in FIG. 4.

The Group III-V nitride compound semiconductor laser has such property as described above because of the following reasons: generally, reduction of the mode gain due to reduction of the light confinement coefficient Γ requires the gain of a well layer to compensate for the reduction, which in turn requires an increase in dose of carriers to be injected (threshold carrier density increase) to the well layer for oscillation. A proportion of the amount of change in optical gain (differential gain) of a well with reference to the amount of change in carrier concentration is remarkably high in the present materials, which only requires a small dose of carriers to be injected. This is considered a reason that the threshold current does not increase considerably.

In addition, the InGaN well layer has extremely high light absorption in the well layer as compared to other materials due to the occurrence of In composition ratio fluctuations in the well layer, as discussed above. This property is considered a reason that the differential efficiency is improved considerably with reduction of the light confinement coefficient Γ.

Further, reduction in the amount of light absorption due to the reduction of the light confinement coefficient Γ leads to reduction in mode gain required for oscillation, which cancels out to some degree the effect of increase in threshold current. This is also considered a reason that the threshold current does not increase considerably with reference to the Γ dependence.

It is found from the Γ dependences shown in FIGS. 3 and 4 that when the light confinement coefficient Γ becomes less than 1.5%, the threshold current increases considerably, while the amount of improvement in differential efficiency becomes small. It is therefore preferable that the lowest limit to the light confinement coefficient Γ be about 1.5%.

It is further found from the Γ dependence of differential efficiency shown in FIG. 4 that differential efficiency of 1.6 W/A or more can be obtained with the light confinement coefficient Γ being 3.0% or less. Moreover, differential efficiency of 1.7 W/A or more can be obtained with the light confinement coefficient Γ being 2.6% or less.

Therefore, for a semiconductor laser having an active layer of double-quantum-well structure that includes two InGaN well layers to have differential efficiency of 1.6 W/A or more with a threshold current on a practical level, the light confinement coefficient Γ to the well layer needs to be set in the range of 1.5 to 3.0, and to have differential efficiency of 1.7 W/A or more with a threshold current on a practical level, the light confinement coefficient Γ to the well layer needs to be set in the range of 1.5 to 2.6.

In the Group III-V nitride compound semiconductor lasers reported to date, the value of differential efficiency of laser light emitted from a front-end face has been less than 1.6 W/A. It is therefore shown that differential efficiency that has been conventionally unattainable can be attained in the present invention.

The increase in differential efficiency allows a current value required for equivalent light output to be reduced, bringing about significant advantages including reduction in load to a laser drive circuit, reduction in heating value due to power consumption reduction, and the like.

Figure 5:
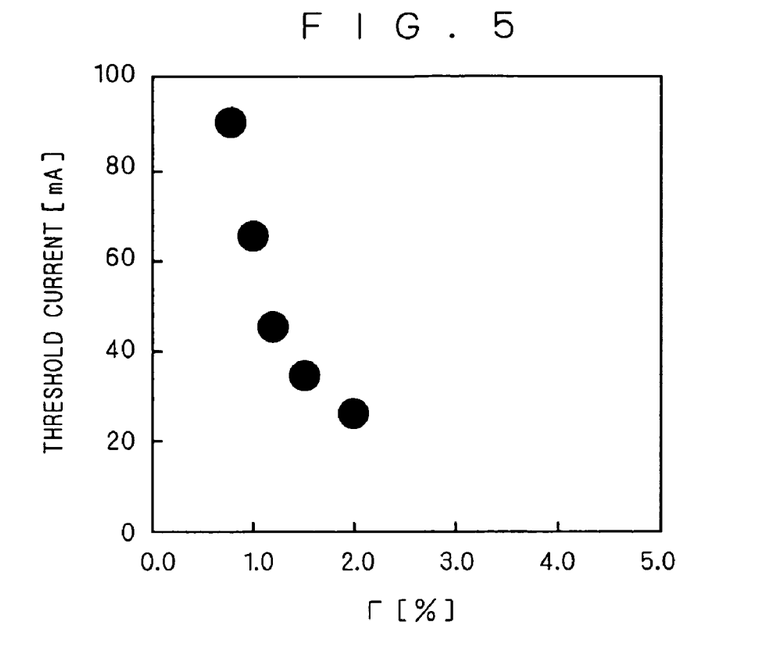
FIG. 5 illustrates the $\Gamma$ dependence of a threshold current in a semiconductor laser having an active layer that includes only one well layer having a thickness of 5 nm.
Figure 6:
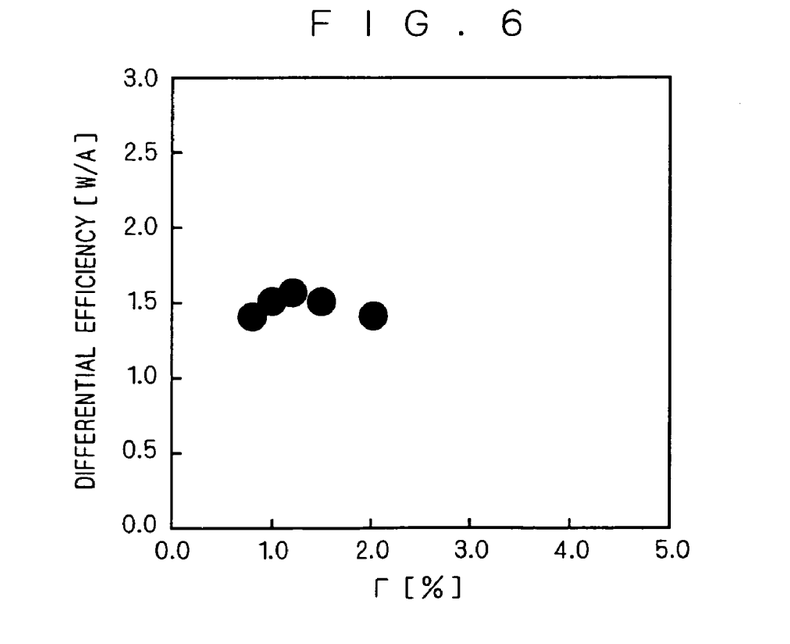
FIG. 6 illustrates the $\Gamma$ dependence of differential efficiency in a semiconductor laser having an active layer that includes only one well layer having a thickness of 5 nm.

FIGS. 5 and 6 illustrate the Γ dependences of a threshold current and differential efficiency, respectively, in a semiconductor laser having an active layer that includes only one well layer having a thickness of 5 nm.

As shown, reduction of the light confinement coefficient Γ is accompanied with significant deterioration (increase) of the threshold current and little improvement (increase) of the differential efficiency. This is obvious as compared to the Γ dependences (FIGS. 3 and 4) of threshold current and differential efficiency in the semiconductor laser having an active layer that includes two well layers.

The Γ dependences of the threshold current and differential efficiency in the semiconductor laser having an active layer that includes only one well layer demonstrates such property as described above because of the following reason: with one well layer, there is only one potential barrier for the carriers in the well, and as a result of overflow, the carriers do not recombine in the well to leak electrons, thus not contributing to light output.

In addition, in order to obtain the same light confinement coefficient Γ with one well layer as that in two well layers having the same thickness as the one well layer, it is necessary to increase the thickness of the well layer to almost the same as the sum of the thicknesses of the two well layers, or alternatively, concentrate light distribution in a vertical direction, namely a near-field pattern, as close as possible to the well.

However, increase in thickness of the well layer will undermine the quantum effect of the well layer, producing disadvantages such as an increase in threshold current. And reduction in near-field pattern in the vertical direction will increase a far-field pattern. These are inappropriate properties for an optical pickup purpose.

As has been described, various kinds of problems are likely to arise when the number of well layers forming the active layer is "1". It is therefore preferable that the number of well layers be "2" or more in order to obtain the effects of the present invention. When the number of well layers is more than "3", the light confinement coefficient Γ tends to increase further because the foregoing problems associated with one well layer do not arise, and because the volume of well layers and a refractive index near the active layer increase in a standard design. As a result, the light absorption will be reduced more effectively by using the present invention.

First Preferred Embodiment

Figure 7:
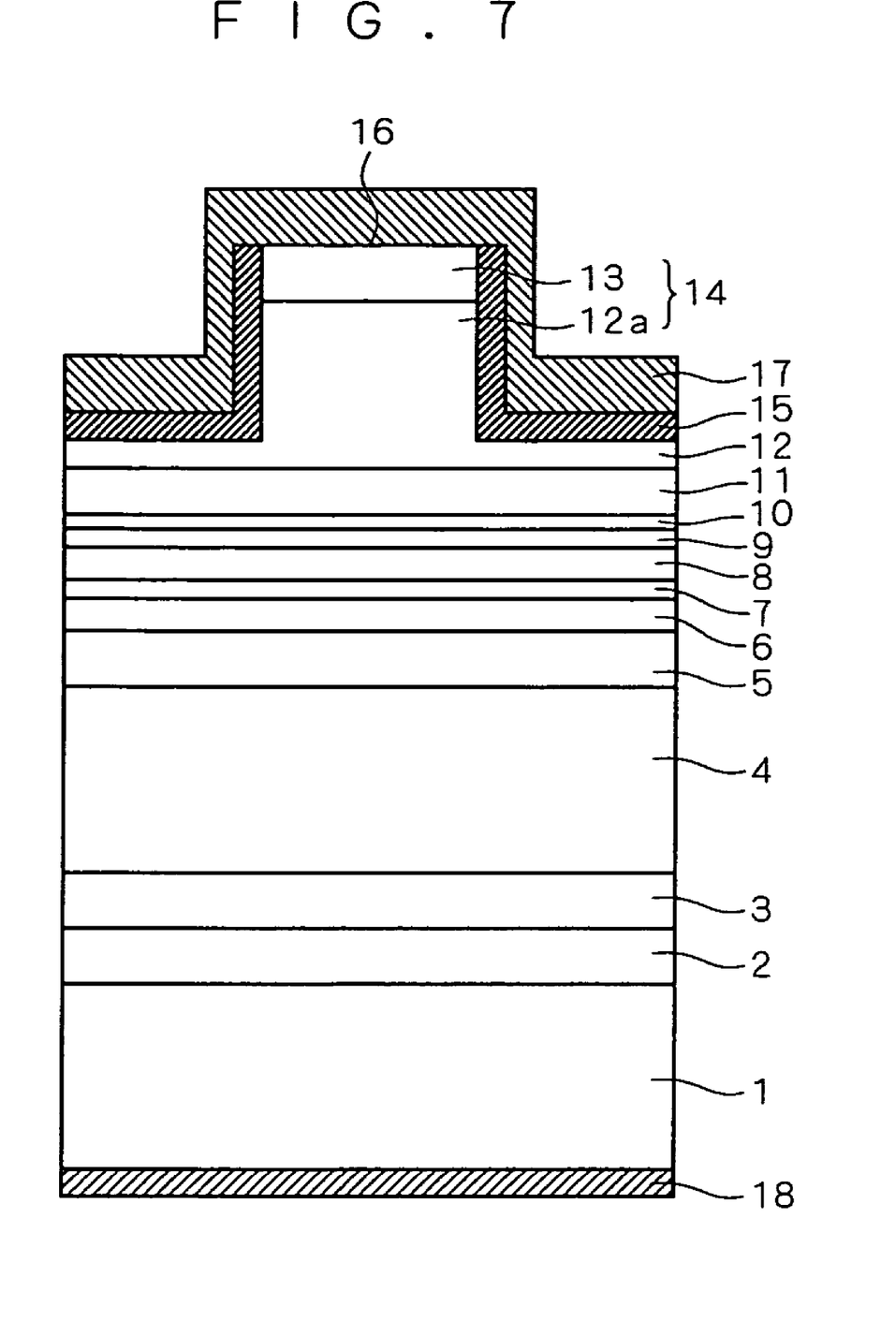
FIG. 7 is a cross-sectional view illustrating the structure of a semiconductor laser using Group III-V nitride compound semiconductors according to a first preferred embodiment of the present invention.

FIG. 7 is a cross-sectional view illustrating the structure of a semiconductor laser (semiconductor light-emitting device) using the Group III-V nitride compound semiconductors according to a first preferred embodiment of the present invention. This semiconductor laser has a ridge structure and an SCH (Separate Confinement Heterostructure).

As shown, the semiconductor laser according to the first preferred embodiment has an n-type GaN buffer layer 2 formed on a Ga surface, namely one main surface, of a GaN substrate 1. The n-type GaN buffer layer 2 is employed in order to reduce the unevenness of the one main surface of the GaN substrate 1 so that layers can be laminated thereon as evenly as possible.

An n-type AlGaN cladding layer 3 having an Al composition ratio of 0.07, an n-type AlGaN cladding layer 4 having an Al composition ratio of 0.045, and an n-type AlGaN cladding layer 5 having an Al composition ratio of 0.015 are laminated in order on the n-type GaN buffer layer 2. In addition, an n-type GaN optical guide layer 6 and an n-type InGaN-SCH layer 7 are laminated in order on the n-type AlGaN cladding layer 5. The n-type InGaN-SCH layer 7 may be of undoped structure and have an In composition ratio of 0.02, for example.

Figure 8:
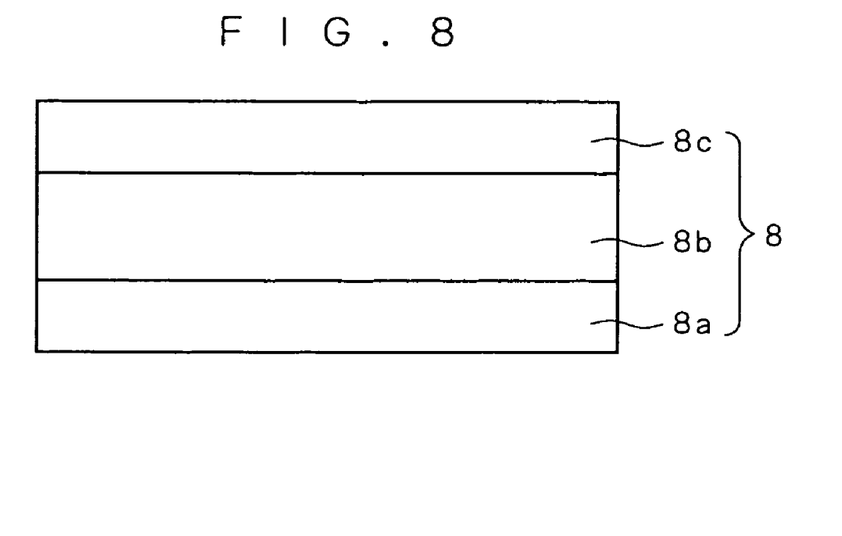
FIG. 8 is a cross-sectional view illustrating the internal structure of an active layer shown in FIG. 7.

An active layer 8 is formed on the n-type InGaN-SCH layer 7. As shown in FIG. 8, the active layer 8 has a double-quantum-well structure in which an undoped InGaN well layer 8a having an In composition ratio of 0.12, an InGaN barrier layer 8b having an In composition ratio of 0.02, and an undoped InGaN well layer 8c having an In composition ratio of 0.12 are laminated in order, for example.

Further, a p-type InGaN-SCH layer 9, a p-type AlGaN electron barrier layer 10, and a p-type GaN optical guide layer 11 are laminated in order on the active layer 8. The p-type InGaN-SCH layer 9 may be of undoped structure and have an In composition ratio of 0.02, for example, and the p-type AlGaN electron barrier layer 10 may have an Al composition ratio of 0.2, for example.

A p-type AlGaN cladding layer 12 having an Al composition ratio of 0.07 is formed on the p-type GaN optical guide layer 11. This p-type AlGaN cladding layer 12 partly includes a protruding ridge portion 12a upon which is formed a p-type GaN contact layer 13. The ridge portion 12a and the p-type GaN contact layer 13 thereon form a ridge 14. The ridge 14 is formed by laminating the p-type AlGaN cladding layer 12 and the p-type GaN contact layer 13 on the p-type GaN optical guide layer 11, and then performing an etching process toward a (1-100) direction. The ridge 14 is formed to be positioned over a low-defect region between high-dislocation regions having widths of from several μm to several ten μm that are formed in a stripe shape on the GaN substrate 1.

The GaN substrate 1 further has an n-type electrode 18 formed on an N surface, namely the other main surface thereof opposite to the Ga surface. The n-type electrode 18 has a structure in which titanium (Ti) and Au films are laminated in order, for example.

An insulating film 15 is formed on the surface of the p-type AlGaN cladding layer 12 except the ridge portion 12a, and on side surfaces of the ridge 14 (the ridge portion 12a and the p-type GaN contact layer 13). A p-type electrode 17 is then formed to cover the p-type GaN contact layer 13 and the insulating film 15. The insulating film 15 is provided to protect and electrically isolate the side surfaces of the ridge portion 12a and the surface of the p-type AlGaN cladding layer 12 except the ridge portion 12a.

The n-type GaN buffer layer 2 has a thickness of 1 μm, for example, and is doped with an n-type impurity, for example silicon (Si). The n-type AlGaN cladding layers 3, 4 and 5 have thicknesses of 0.4 μm, 1.0 μm and 0.3 μm respectively, for example, and are doped with an n-type impurity, for example Si.

The n-type InGaN-SCH layer 7 and the p-type InGaN-SCH layer 9 are both 30 nm in thickness. In the active layer 8 of double-quantum-well structure, the InGaN well layers 8a and 8c are both 5.0 nm in thickness, for example, and the InGaN barrier layer 8b is 8.0 nm in thickness. The p-type AlGaN electron barrier layer 10 is 20 nm in thickness, for example, and is doped with a p-type impurity, for example magnesium (Mg). The p-type GaN optical guide layer 11 is 100 nm in thickness, for example.

The p-type AlGaN cladding layer 12 as a p-side cladding layer is 500 nm in thickness, for example, and is doped with a p-type impurity, for example Mg. The p-type GaN contact layer 13 is 20 nm in thickness, for example, and is doped with a p-type impurity, for example Mg.

The insulating film 15 is formed of an SiO$_2$ film having a thickness of 200 nm, and the p-type electrode 17 has a structure in which palladium (Pd) and gold (Au) films are laminated in order, for example.

Table 1 indicates the material, thickness and refractive index "n" of each layer forming the semiconductor laser according to the first preferred embodiment. The layer numbers in the leftmost column of Table 1 correspond to the reference numbers of the layers in the FIG. 7 structure.

TABLE 1

| Layer No. | Layer Name | Material | Thickness | Refractive Index "n" |
|---|---|---|---|---|
| 13 | contact layer | p-GaN | 20 nm | 2.467 |
| 12 | cladding layer | p-Al$_{0.07}$Ga$_{0.93}$N | 500 nm | 2.5013 |
| 11 | guide layer | p-GaN | 100 nm | 2.467 |
| 10 | electron barrier layer | p-Al$_{0.2}$Ga$_{0.8}$N | 20 nm | 2.4257 |
| 9 | SCH layer | In$_{0.02}$Ga$_{0.98}$N | 30 nm | 2.5711 |
| 8 | well layer 8c | In$_{0.12}$Ga$_{0.88}$N | 5.0 nm | 2.765 |
|  | barrier layer 8b | In$_{0.02}$Ga$_{0.98}$N | 8.0 nm | 2.5711 |
|  | well layer 8a | In$_{0.12}$Ga$_{0.88}$N | 5.0 nm | 2.765 |
| 7 | SCH layer | In$_{0.02}$Ga$_{0.98}$N | 30 nm | 2.5711 |
| 6 | guide layer | n-GaN | 80 nm | 2.467 |
| 5 | cladding layer | n-Al$_{0.015}$Ga$_{0.985}$N | 300 nm | 2.5364 |
| 4 | cladding layer | n-Al$_{0.045}$Ga$_{0.955}$N | 1000 nm | 2.5173 |
| 3 | cladding layer | n-Al$_{0.07}$Ga$_{0.93}$N | 400 nm | 2.5013 |
| 1 | GaN substrate | n-GaN |  | 2.467 |

Figure 9:
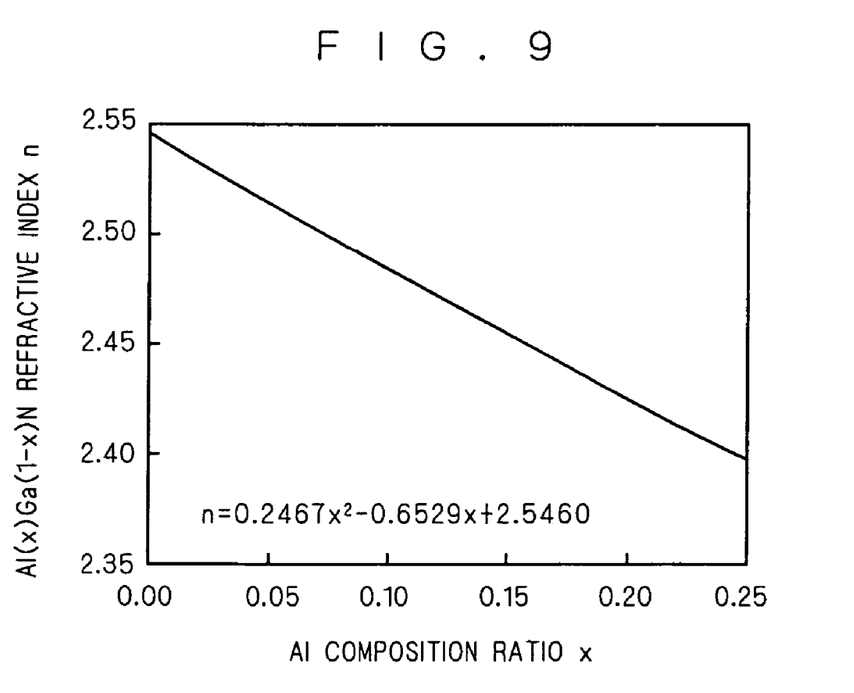
FIG. 9 is a graph illustrating Al composition ratio dependence of a refractive index "n" of an $Al_xGa(1_{-x})N$ layer.
Figure 10:
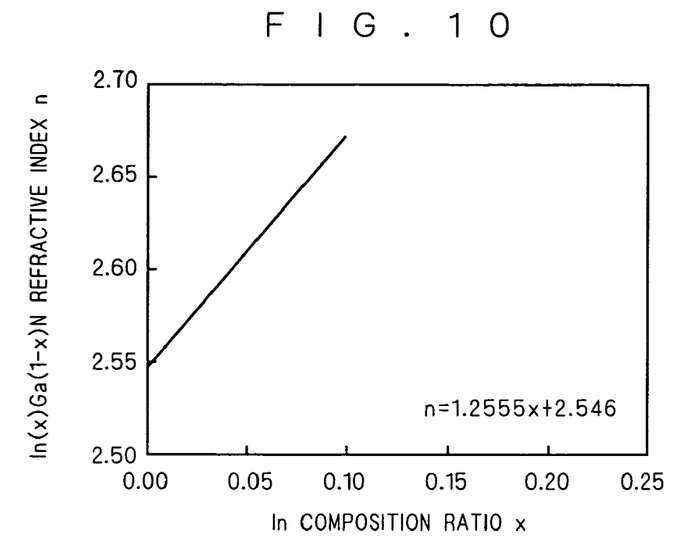
FIG. 10 is a graph illustrating In composition ratio dependence of a refractive index "n" of an $Al_xGa(1_{-x})N$ layer.

FIG. 9 is a graph illustrating Al composition ratio dependence of a refractive index "n" of an Al$_x$Ga$_{(1-x)}$N layer, and FIG. 10 is a graph illustrating In composition ratio dependence of a refractive index "n" of an In$_x$Ga$_{(1-x)}$N layer, with the oscillation wavelength being 405 nm.

The refractive indexes "n" of AlGaN layers such as the n-type AlGaN cladding layers 3 to 5 in Table 1 were calculated based on the Al composition ratio dependence shown in FIG. 9, and the refractive indexes "n" of InGaN layers such as the n-type InGaN-SCH layer 7 were calculated based on the In composition ratio dependence shown in FIG. 10. These are the results of fitting such that simulation results of obtaining a near-field pattern and a far-field pattern from the refractive index "n" of each layer forming the semiconductor laser agree with experimental results of the far-field pattern of the laser in a structure of any kind, with extremely high accuracy.

Due to the double-quantum-well structure, the InGaN Well layers 8a and 8c forming the active layer 8 have a band gap structure that is not a bulk crystal, and therefore take on different values from those of FIG. 10 in a relationship between the In composition ratio and the refractive index "n". The value was determined as "2.765" based on an actual measured value of the far-field pattern. While the refractive index "n" of a well layer varies depending on the structure or thickness of a well, the relationship between band gap and oscillation wavelength is not affected considerably by a change in In composition ratio of the well layer. Accordingly, there is no substantial difference that affects considerably the calculation of light confinement coefficient Γ within a commonly used range of about 0.05 to 0.2 for In composition ratio and about 2 to 10 nm for thickness. Thus, the refractive index "n" of the well layers is allowed to be "2.765" within the above range in terms of accuracy.

In addition, the Al composition ratio dependence and In composition ratio dependence of the refractive index "n" shown in FIGS. 9 and 10 change with an oscillation wavelength, with the refractive index "n" tending to increase with a decrease of the oscillation wavelength, and tending to decrease with an increase of the oscillation wavelength. Since such changes apply to all layers forming the laser, the amount of change takes on the same value with reference to the Al composition ratio and In composition ratio of its material.

For example, the actual refractive index "n" with an oscillation wavelength being 410 nm is smaller than when calculated with an oscillation wavelength being 405 nm. In this case, the refractive index in a light confinement layer (the n-type GaN optical guide layer 6, the n-type InGaN-SCH layer 7, the active layer 8, the p-type InGaN-SCH layer 9, the p-type AlGaN electron barrier layer 10, and the p-type GaN optical guide layer 11) produces the effect of reducing the light confinement coefficient Γ to the active layer 8. On the other hand, the refractive indexes of the p-type and n-type cladding layers are reduced as well, reducing a leak of light to the cladding layers, which produces the effect of increasing the light confinement coefficient Γ to the active layer 8. With those effects conflicting with each other, the light confinement coefficient Γ to the well layer remains substantially unchanged.

For the reasons mentioned above, it is considered that the light confinement coefficient Γ to the well layer does not vary considerably by the oscillation wavelength, so long as the oscillation wavelength is near 405 nm. That is, if the oscillation wavelength is not 405 nm, the almost correct light confinement coefficient Γ to the InGaN well layer can be obtained by calculation based on the Al composition ratio dependence and In composition ratio dependence shown in FIGS. 9 and 10. Calculation results using the refractive index "n" in view of a change in oscillation wavelength indeed supported this idea.

On the basis of the foregoing verified results, simulation was done of the light confinement coefficient Γ of the semiconductor laser according to the first preferred embodiment. A resultant light confinement coefficient Γ (sum of the light confinement coefficients of the InGaN well layers 8a and 8c) was 2.50%, which is less than conventional about 3.7%.

Table 2 indicates the material, thickness and refractive index "n" of each layer forming a conventional semiconductor laser corresponding to the first preferred embodiment. The layer numbers in the leftmost column of Table 2 correspond to the reference numbers of the layers in the FIG. 7 structure.

TABLE 2

| Layer No. | Layer Name | Material | Thickness | Refractive Index "n" |
|---|---|---|---|---|
| 13 | contact layer | p-GaN | 20 nm | 2.467 |
| 12 | cladding layer | p-$Al_{0.07}Ga_{0.93}N$ | 500 nm | 2.5013 |
| 11 | guide layer | p-GaN | 100 nm | 2.467 |
| 10 | electron barrier layer | p-$Al_{0.2}Ga_{0.8}N$ | 20 nm | 2.4257 |
| 9 | SCH layer | $In_{0.02}Ga_{0.98}N$ | 7.0 nm | 2.5711 |
| 8 | well layer | $In_{0.14}Ga_{0.86}N$ | 3.5 nm | 2.765 |
|  | barrier layer | $In_{0.02}Ga_{0.98}N$ | 7.0 nm | 2.5711 |
|  | well layer | $In_{0.14}Ga_{0.86}N$ | 3.5 nm | 2.765 |
|  | barrier layer | $In_{0.02}Ga_{0.98}N$ | 7.0 nm | 2.5711 |
|  | well layer | $In_{0.14}Ga_{0.86}N$ | 3.5 nm | 2.765 |
| 7 | SCH layer | $In_{0.02}Ga_{0.98}N$ | 7.0 nm | 2.5711 |
| 6 | guide layer | n-GaN | 100 nm | 2.467 |
| 3 | cladding layer | n-$Al_{0.07}Ga_{0.93}N$ | 1100 nm | 2.5013 |
| 1 | GaN substrate | n-GaN |  | 2.467 |

Figure 11:
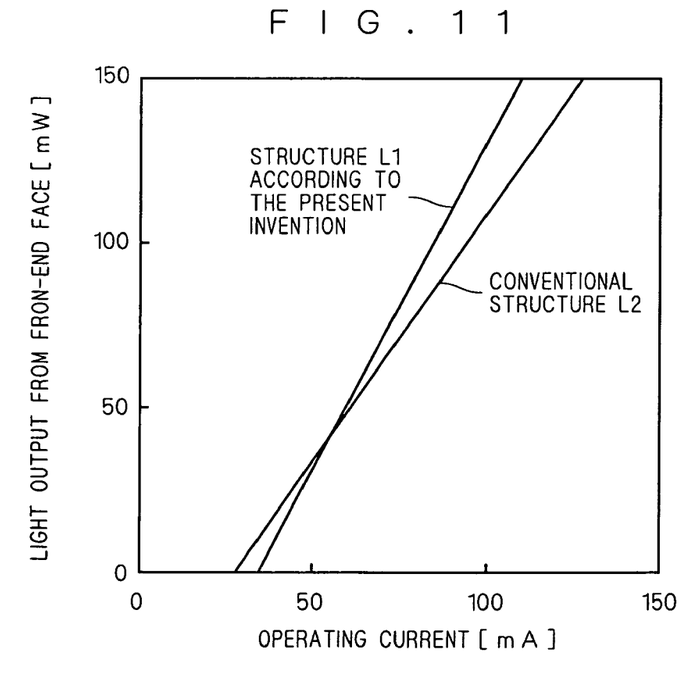
FIG. 11 is a graph illustrating a measured result of light output from a front-end face of the semiconductor laser according to the first preferred embodiment.

FIG. 11 is a graph illustrating measured results of light output from a front-end face of the semiconductor laser according to the first preferred embodiment. A light output change L1 in FIG. 11 indicates measured results of light output from the front-end face of the semiconductor laser according to the first preferred embodiment, with the front-end face being coated with 10% reflectivity and a rear-end face with 95% reflectivity. A light output change L2 indicates measured results of light output from a front-end face of the conventional semiconductor laser, with the front-end face and rear-end face with the same reflectivity as the above.

With reference to FIG. 11, differential efficiency (proportion of light output from a front-end face with reference to an operating current) of the conventional structure is 1.5 W/A as indicated by the light output change L2, whereas differential efficiency according to the first preferred embodiment is considerably improved to 1.95 W/A as indicated by the light output change L1. This allows an operating current for light output of 150 mW to be reduced from conventionally required 130 mA to 110 mA in the first preferred embodiment.

This result is presumably due to the reduction in light absorption in the well layer resulting from the reduction in light confinement coefficient Γ to the well layer.

Figure 12:
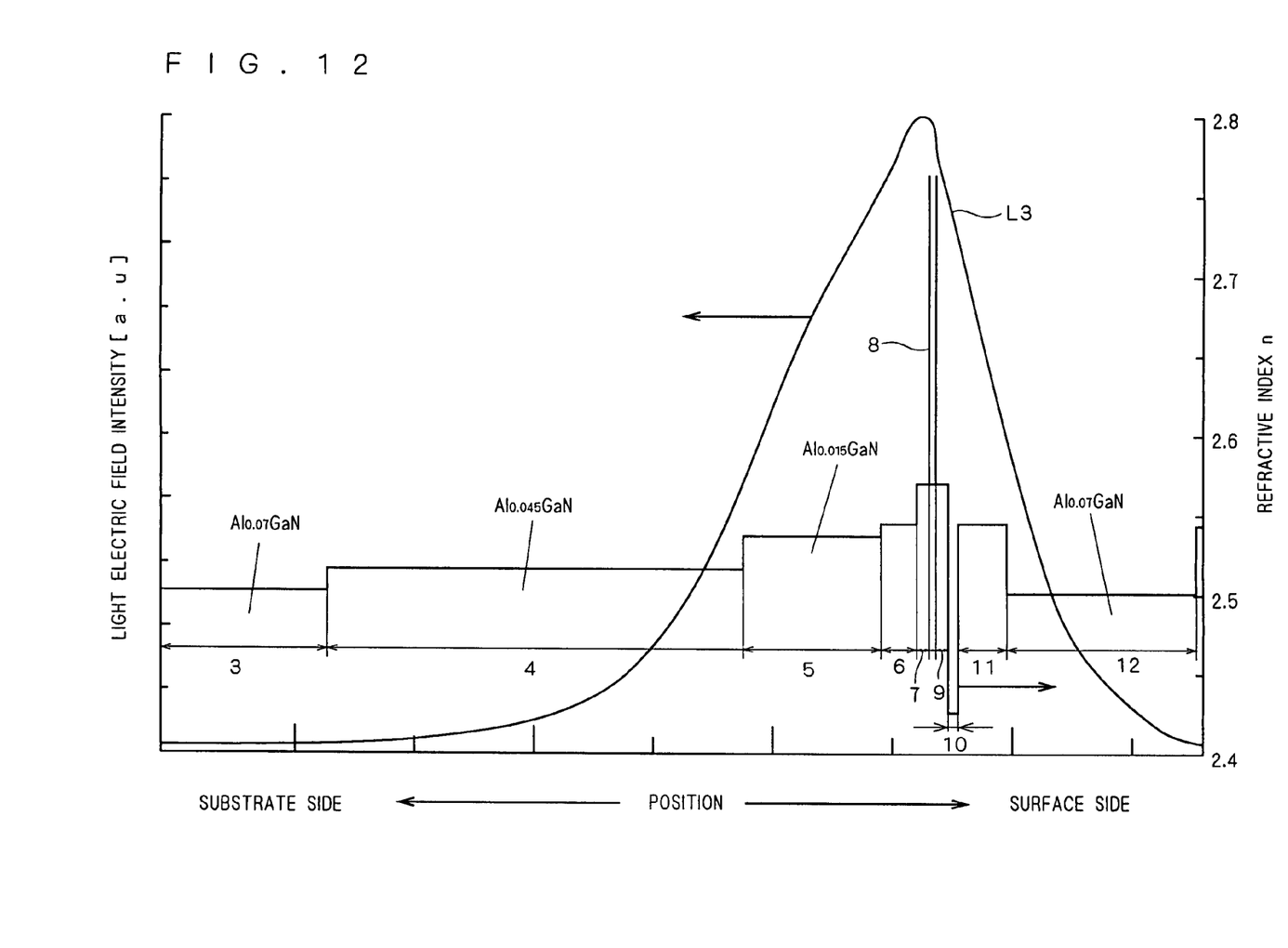
FIG. 12 illustrates simulation results of refractive index distribution and light electric field intensity distribution in a ridge central portion in a vertical direction according to the first preferred embodiment.

FIG. 12 illustrates simulation results of refractive index distribution and light electric field intensity distribution in a ridge central portion in a vertical direction according to the first preferred embodiment. The light electric field intensity distribution was calculated two-dimensionally by doing simulation with respect to a laser layer structure on a two-dimensional surface perpendicular to the direction of light travel, with the distribution in the ridge central portion being shown. The square of light electrode intensity is light intensity.

In the laser structure according to the first preferred embodiment, the n-type AlGaN cladding layers 3 to 5 of three-layer structure are used as an n-type AlGaN cladding layer, with the n-type AlGaN cladding layers 3 to 5 having Al composition ratios different from each other, namely 0.07, 0.045 and 0.015, respectively.

As shown in FIG. 12, light is drawn into the n-type AlGaN cladding layer 5 having the Al composition ratio of 0.015 with a relatively high refractive index. Light intensity to the n-type AlGaN cladding layer 5 thus increases, causing the center (peak position) of light intensity to be shifted from the active layer 8 to the n-side (n-type AlGaN cladding layers 3 to 5 side), resulting in reduction of the light confinement coefficient Γ to the well layers in the active layer 8.

The n-type AlGaN cladding layer 3 having the Al composition ratio of 0.07 is provided in order to control a leak of light distribution to the GaN substrate 1. The presence or absence of this n-type AlGaN cladding layer 3 hardly affects the light confinement coefficient Γ in the well layers of the active layer 8.

By employing AlGaN as n-type and p-type cladding layers, a layer having a wide band gap and excellent crystalline properties can be obtained in the first preferred embodiment.

As for the Al composition ratio of an n-type AlGaN cladding layer, the higher the Al composition ratio, the worse the crystalline properties with significant lowering of reliability. Further, a refractive index decreases, making a light electric field less prone to expand to the n-side but more prone to be concentrated on the periphery of an active layer. This makes it hard to reduce the light confinement coefficient Γ in the well layer. On the other hand, when the Al composition ratio is low, the refractive index increases so that the light electric field expands extensively to the n-side than is necessary. This makes the light confinement coefficient Γ too small.

From the above, it is preferable that the Al composition ratio of an n-type AlGaN cladding layer, or of at least one n-type AlGaN cladding layer if there are a plurality of them, be 0.005 or higher and 0.08 or lower, and more preferably 0.005 or higher and 0.06 or lower, and still more preferably 0.005 or higher and 0.04 or lower.

Further, when a refractive index is increased higher in an n-type cladding layer than a p-type cladding layer, the light electric field is attracted to the n-layer side, increasing the amount of light confinement in the n-type cladding layer. Consequently, the light confinement coefficient Γ can be reduced easily. The same effect can be attained by making the n-type layer a plurality of cladding layers, and providing one of the layers with a high refractive index than that of the p-type cladding layer.

One of the features of the first preferred embodiment is that, in a semiconductor light-emitting device using the Group III-V nitride compound semiconductors and having an active layer of multi-quantum-well structure that includes at least two well layers, the plurality of well layers have the same composition, and a well layer (InGaN well layer 8a) nearest a substrate (GaN substrate 1) among the plurality of well layers has a light confinement coefficient higher than that of a well layer (InGaN well layer 8c) farthest from the substrate, by providing a first cladding layer (n-type AlGaN cladding layers 4 and 5) of a first conductivity type provided as a lower layer of the active layer 8, and a second cladding layer (p-type AlGaN cladding layer 12) of a second conductivity type provided as an upper layer of the active layer 8, with the first cladding layer having a refractive index higher than that of the second cladding layer.

Namely, of the light being confined in the active layer 8 shown in FIG. 8, an object of the amount of light distributed by each of the plurality of InGaN well layers 8a and 8c forming the active layer 8 and having the same composition is not ensured. The amounts clearly differ between the InGaN well layer 8a nearest the substrate side and the InGaN well layer 8c farthest from the substrate side.

This is due to the fact that the light being confined in the active layer 8 is drawn into the InGaN well layer 8a near the n-type AlGaN cladding layers 4 and 5 that are provided on the GaN substrate 1 side and have a refractive index higher than that of the p-type AlGaN cladding layer 12. Stated another way, the light being confined in the InGaN well layer 8a near the n-type AlGaN cladding layers 4 and 5 that are provided on the GaN substrate 1 side and have a high refractive index is greater than the light being confined in the InGaN well layer 8c near the p-type AlGaN cladding layer 12 that is provided on the side far from the GaN substrate 1 and has a low refractive index.

Namely, the InGaN well layer 8a has a light confinement coefficient higher than that of the InGaN well layer 8c. This allows light intensity to the p-type electrode 17 to be reduced, producing a particular effect of improving differential efficiency of the device. This aspect is described below in detail.

Generally, in a semiconductor laser, the distance between an electrode (second electrode) provided on an opposite side to a substrate and an active layer is extremely small with reference to the distance between an electrode (first electrode) provided on the substrate side and the active layer. The distance between the active layer and the second electrode is usually about 400 nm in a nitride semiconductor laser, for example, which is extremely small considering that this distance is about 2 μm or more in semiconductor lasers using other materials such as InP or GaAs materials. The reason for setting this distance small is that the serial resistance value of a crystal increases with an increase of this distance, and crystalline resistance in a nitride semiconductor is extremely high.

Due to the closeness between the active layer and the second electrode, a light electric field that is too important to neglect exists in the second electrode as compared to the first electrode, resulting in the existence of light absorption to some degree. This causes the center (peak position) of light intensity to be shifted from the active layer 8 to the second electrode side, further expanding the light electric field to the second electrode side. The light absorption thus increases, with a high possibility of causing property problems such as an increase in oscillation threshold value or deterioration of luminous efficiency.

From the above, the light electric field is expanded to the first electrode, namely the n-type electrode 18 side, rather than to the second electrode, namely the p-type electrode 17 side, as a method to reduce the light confinement coefficient Γ in the first preferred embodiment. That is, the refractive index of the n-type AlGaN cladding layers 5 and 4 provided on the GaN substrate 1 side below the active layer 8 is increased higher than that of the p-type AlGaN cladding layer 12 provided on the opposite side to the GaN substrate 1 above the active layer 8, so that the center of light intensity is shifted to the first electrode, namely the n-type electrode 18 side, thereby reducing light intensity on the second electrode, namely the p-type electrode 17. The foregoing property problems can be thus alleviated.

(Manufacturing Method)

A method of manufacturing the semiconductor laser according to the first preferred embodiment will be described with reference to FIG. 7. First, on the GaN substrate 1 whose surface has been washed by thermal cleaning and the like, the n-type GaN buffer layer 2 is grown by metal organic chemical vapor deposition (MOCVD) at a growth temperature of 1000° C., for example.

Laminated thereon in order by MOCVD are the n-type AlGaN cladding layers 3 to 5, the n-type GaN optical guide layer 6, the undoped n-type InGaN-SCH layer 7, the active layer 8 of double-quantum-well structure including the undoped InGaN well layers 8a, 8c and the InGaN barrier layer 8b, the undoped p-type InGaN-SCH layer 9, the p-type AlGaN electron barrier layer 10, the p-type GaN optical guide layer 11, the p-type AlGaN cladding layer 12, and the p-type GaN contact layer 13.

Growth temperatures for those layers are 1000° C. for the n-type AlGaN cladding layers 3 to 5 and the n-type GaN optical guide layer 6, 780° C. for the undoped n-type InGaN-SCH layer 7 to the undoped p-type InGaN-SCH layer 9, and 1000° C. for the p-type AlGaN electron barrier layer 10 to the p-type GaN contact layer 13.

Upon completion of such crystal growth on a wafer, a resist (not shown in FIG. 7) is applied to a front surface of the wafer, to form a resist pattern in a predetermined shape corresponding to the shape of a mesa part by lithography. With this resist pattern as a mask, the p-type GaN contact layer 13 and the p-type AlGaN cladding layer 12 are etched to leave only part of the p-type AlGaN cladding layer 12 by RIE (Reactive Ion Etching), for example. As a result, the ridge portion 12a of the p-type AlGaN cladding layer 12 and the p-type GaN contact layer 13 below the resist pattern form the ridge 14.

Next, the insulating film 15 which is an SiO₂ film having a thickness of 0.2 μm, for example, is formed on the entire surface of the wafer by CVD, vacuum evaporation, spattering and the like, while leaving the resist pattern having been used as a mask. The so-called lift-off is then performed by removing the resist pattern and the insulating film 15 formed on the resist pattern as well. As a result, an opening 16 is formed on the ridge 14.

Processing then continues with formation of platinum (Pt) and Au in order on the entire surface of the wafer by vacuum evaporation, for example, then application of a resist, formation of a resist pattern by lithography, and then wet or dry etching. Thus formed is the p-type electrode 17 (pattern) as shown in FIG. 7.

Then, Ti and Al films are formed in order on the entire rear surface of the GaN substrate 1 by vacuum evaporation, thus obtaining the n-type electrode 18. An alloy process (heat treatment) is then performed to ohmic-contact the n-type electrode 18.

Subsequently, the substrate is processed into the shape of a bar by cleaving and the like (along a first direction) to form both end faces of a resonator. After coating the end faces of the resonator, the bar is rendered as a chip by cleaving and the like (along a direction perpendicular to the first direction). The semiconductor laser according to the first preferred embodiment is thus formed.

It is naturally conceivable to provide a structure in which, contrary to the structure in the first preferred embodiment, the second cladding layer provided as an upper layer of the active layer (opposite side to the substrate) has a refractive index higher than that of the first cladding layer provided as a lower layer of the active layer (substrate side). Again in this structure, the center of light intensity is shifted from the active layer 8 to the second cladding layer (second electrode) side, allowing the light confinement coefficient $\Gamma$ to the well layer of the active layer to be reduced.

Second Preferred Embodiment

Table 3 indicates the material, thickness and refractive index "n" of each layer forming a semiconductor laser according to a second preferred embodiment of the present invention. The layer numbers in the leftmost column of Table 3 correspond to the reference numbers of the layers in the FIG. 7 structure.

TABLE 3

| Layer No. | Layer Name | Material | Thickness | Refractive Index "n" |
|---|---|---|---|---|
| 13 | contact layer | p-GaN | 20 nm | 2.467 |
| 12 | cladding layer | p-$Al_{0.07}Ga_{0.93}N$ | 500 nm | 2.5013 |
| 11 | guide layer | p-GaN | 100 nm | 2.467 |
| 10 | electron barrier layer | p-$Al_{0.2}Ga_{0.8}N$ | 20 nm | 2.4257 |
| 9 | SCH layer | $In_{0.02}Ga_{0.98}N$ | 30 nm | 2.5711 |
| 8 | well layer | $In_{0.14}Ga_{0.86}N$ | 3.5 nm | 2.765 |
|  | barrier layer | $In_{0.02}Ga_{0.98}N$ | 7.0 nm | 2.5711 |
|  | well layer | $In_{0.14}Ga_{0.86}N$ | 3.5 nm | 2.765 |
|  | barrier layer | $In_{0.02}Ga_{0.98}N$ | 7.0 nm | 2.5711 |
|  | well layer | $In_{0.14}Ga_{0.86}N$ | 3.5 nm | 2.765 |
| 7 | SCH layer | $In_{0.02}Ga_{0.98}N$ | 30 nm | 2.5711 |
| 6 | guide layer | n-GaN | 80 nm | 2.467 |
| 5 | cladding layer | n-$Al_{0.015}Ga_{0.985}N$ | 330 nm | 2.5364 |
| 4 | cladding layer | n-$Al_{0.045}Ga_{0.955}N$ | 1000 nm | 2.5173 |
| 3 | cladding layer | n-$Al_{0.07}Ga_{0.93}N$ | 400 nm | 2.5013 |
| 1 | GaN substrate | n-GaN |  | 2.467 |

As shown in Table 3, the difference of the second preferred embodiment from the first preferred embodiment is that the active layer 8 has a tripe-quantum-well structure including three well layers and two barrier layers. The In composition ratio and thickness of the three well layers, and the thickness of the two barrier layers are also different from those in the first preferred embodiment.

The same simulation as the first preferred embodiment was done of the light confinement coefficient $\Gamma$ of the semiconductor laser according to the second preferred embodiment. A resultant light confinement coefficient $\Gamma$ (sum of the light confinement coefficients of the three InGaN well layers) was 2.58%.

In addition, it was found from the actual measurement of differential efficiency on a front-end face, with the front-end face being coated with 10% reflectivity and a rear-end face with 95% reflectivity, that the differential efficiency is considerably improved from conventional 1.5 W/A to 1.95 W/A.

The semiconductor laser according to the second preferred embodiment only differs in layer structure from the first preferred embodiment, and is manufactured in the same way as in the first preferred embodiment. The description thereof is thus omitted.

Third Preferred Embodiment

Figure 13:
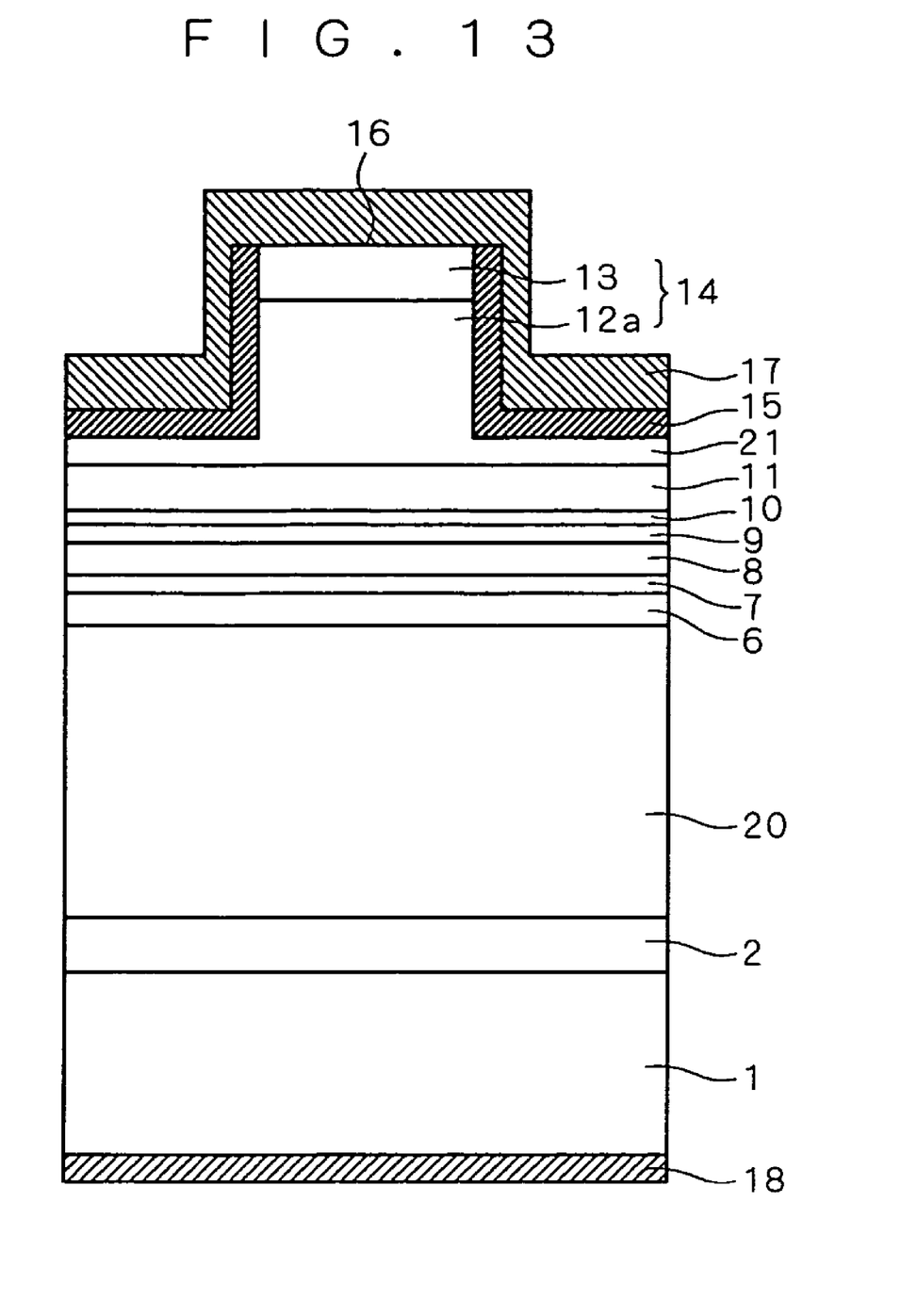
FIG. 13 is a cross-sectional view illustrating the structure of a semiconductor laser using the Group III-V nitride compound semiconductors according to a third preferred embodiment of the present invention.

FIG. 13 is a cross-sectional view illustrating the structure of a semiconductor laser using the Group III-V nitride compound semiconductors according to a third preferred embodiment of the present invention. As shown, this semiconductor laser has the same layer structure as that of the first preferred embodiment illustrated in FIG. 7, except that the three n-type AlGaN cladding layers 3 to 5 are replaced with one n-type AlGaN cladding layer 20, and the p-type AlGaN cladding layer 12 is replaced with a p-type AlGaN cladding layer 21.

Table 4 indicates the material, thickness and refractive index "n" of each layer forming the semiconductor laser corresponding to the third preferred embodiment. The layer numbers in the leftmost column of Table 4 correspond to the reference numbers of the layers in the FIG. 13 structure.

TABLE 4

| Layer No. | Layer Name | Material | Thickness | Refractive Index "n" |
|---|---|---|---|---|
| 13 | contact layer | p-GaN | 20 nm | 2.467 |
| 21 | cladding layer | p-$Al_{0.03}Ga_{0.97}N$ | 570 nm | 2.5269 |
| 11 | guide layer | p-GaN | 100 nm | 2.467 |
| 10 | electron barrier layer | p-$Al_{0.2}Ga_{0.8}N$ | 20 nm | 2.4257 |
| 9 | SCH layer | $In_{0.02}Ga_{0.98}N$ | 30 nm | 2.5711 |
| 8 | well layer 8c | $In_{0.12}Ga_{0.88}N$ | 5.0 nm | 2.765 |
|  | barrier layer 8b | $In_{0.02}Ga_{0.98}N$ | 8.0 nm | 2.5711 |
|  | well layer 8a | $In_{0.12}Ga_{0.88}N$ | 5.0 nm | 2.765 |
| 7 | SCH layer | $In_{0.02}Ga_{0.98}N$ | 30 nm | 2.5711 |
| 6 | guide layer | n-GaN | 80 nm | 2.467 |
| 20 | cladding layer | n-$Al_{0.03}Ga_{0.97}N$ | 2500 nm | 2.5269 |
| 1 | GaN substrate | n-GaN |  | 2.467 |

As shown in Table 4, in the third preferred embodiment, the Al composition ratio of the p-type AlGaN cladding layer 21 and the n-type AlGaN cladding layer 20 is set to "0.03", which is lower than that of conventional p-type AlGaN cladding layer and n-type AlGaN cladding layer, thus increasing the refractive indexes "n" of the respective layers higher than conventional ones. As a result, a leak of light to the n-type AlGaN cladding layer 20 and the p-type AlGaN cladding layer 21 increases, reducing the light confinement coefficient $\Gamma$ to the well layers.

The same simulation as the first preferred embodiment was done of the light confinement coefficient $\Gamma$ of the semiconductor laser according to the third preferred embodiment. A resultant light confinement coefficient $\Gamma$ (sum of the light confinement coefficients of the two InGaN well layers 8a and 8c) was 2.62%.

In addition, it was found from the actual measurement of differential efficiency on a front-end face, with the front-end face being coated with 10% reflectivity and a rear-end face with 95% reflectivity, that the differential efficiency is considerably improved from conventional 1.5 W/A to 1.95 W/A.

The semiconductor laser according to the third preferred embodiment only differs in layer structure from the first preferred embodiment, and is manufactured in the same way as in the first preferred embodiment. The description thereof is thus omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor light-emitting device comprising:
a substrate; and
a plurality of III-V compound semiconductor layers supported by said substrate, each layer containing at least Ga and N as principal constituents, wherein said plurality of compound semiconductor layers include, sequentially arranged,
    a first cladding layer of a first conductivity type, said first cladding layer including a plurality $Al_xGa_{1-x}N$ ($0 \leq x \leq 1$) layers in which x increases toward said substrate, each of said $Al_xGa_{1-x}N$ layers having a respective refractive index,
    an active layer with a multi-quantum-well structure that includes at least two InGaN well layers, said first cladding layer being interposed between said substrate and said active layer, and
    a second cladding layer of a second conductivity type, opposite the first conductivity type and disposed on an opposite side of said active layer from said first cladding layer, said second cladding layer having a refractive index, wherein said light-emitting device has a light confinement coefficient in a range from 1.5% to 2.0%, the light confinement coefficient indicating proportion of light in said at least two InGaN well layers to overall waveguide light in said light-emitting device during light emission by said light-emitting device.

2. The semiconductor light-emitting device according to claim 1, wherein at least one $Al_xGa_{1-x}N$ layer included in said first cladding layer has an Al composition ratio in a range from 0.005 to 0.08.

3. The semiconductor light-emitting device according to claim 1, wherein at least one $Al_xGa_{1-x}N$ layer included in said first cladding layer has an Al composition ratio in a range from 0.005 to 0.06.

4. The semiconductor light-emitting device according to claim 1, wherein at least one $Al_xGa_{1-x}N$ layer included in said first cladding layer has an Al composition ratio in a range from 0.005 to 0.04.

5. The semiconductor light-emitting device according to claim 1 wherein the refractive indices of said layers of said first cladding layer, excluding the layer of said first cladding layer closest to said substrate, are higher than the refractive index of said second cladding layer.

* * * * *